United States Patent [19]
Lindmayer

[11] 3,769,558
[45] Oct. 30, 1973

[54] SURFACE INVERSION SOLAR CELL AND METHOD OF FORMING SAME

[75] Inventor: Joseph Lindmayer, Bethesda, Md.

[73] Assignee: Communications Satellite Corporation, Washington, D.C.

[22] Filed: Dec. 3, 1971

[21] Appl. No.: 204,699

[52] U.S. Cl. .. 317/234 R, 317/235 N, 317/235 AG, 317/235 AZ
[51] Int. Cl. .......... H01l 15/00
[58] Field of Search .......... 317/235 AG, 235 AZ, 317/235 N

[56] References Cited

UNITED STATES PATENTS 3,457,470 7/1969 Meuleman .......... 317/234
3,396,052 8/1968 Rand .......... 317/201

*Primary Examiner*—Martin H. Edlow
*Attorney*—Richard C. Sughrue et al.

[57] ABSTRACT

An improved semiconductor device, particularly suitable as a solar cell, has a surface inversion layer with increased charge density. A *p*-type semiconductor material is covered with a layer comprising oxides of silicon and chromium. The addition of the chromium oxides increases the charge density of the inversion layer by orders of magnitude over that created by the silicon oxide alone. In the fabrication process, a silicon oxide layer is formed first, followed by a layer of elemental chromium. Both layers are oxidized by placing the device in an oxygen atmosphere at temperatures in excess of 800° C.

6 Claims, No Drawings

SURFACE INVERSION SOLAR CELL AND METHOD OF FORMING SAME

BACKGROUND OF THE INVENTION

The invention is in the field of semiconductor solar cells, and more particularly is a semiconductor solar cell with an inversion layer having a relatively high concentration of charge carriers and the method of fabricating same.

Semiconductor solar cells are well known in the art. They have *p-n* junctions near the surface of the device which are exposed to solar light radiation. The photoelectric energy is created by light waves which generate hole-electron pairs. State of the art solar cells, such as Si or CdS cells are sensitive to wavelengths from about 1 $\mu$ down to 0.45 $\mu$. The loss of response at around 0.45 $\mu$ is most unfortunate because it is near the point where the sun has its maximum output.

Thelong wavelength threshold is determined by the optical bandgap of the semiconductor and the short wavelength cutoff arises from the fact that the penetration of light becomes less than the junction depth. Typical junction depth is 0.4 $\mu$ below the surface, but even with this seemingly shallow junction, light wavelengths below 0.5 $\mu$ do not penetrate deep enough to reach the junction, and the associated carrier pairs recombine without contributing to the photocurrent.

The long technique, known as creating an inversion layer, can be used for creating extremely shallow junctions, e.g., 50 A from the surface, but this has not been suitable for solar cells because the concentration of charge carriers in the inversion layer is too low for practical use. For example, it is well known that a silicon dioxide layer formed on the surface of *p*-type silicon or other *p*-type semiconductors will induce an *n*-type inversion layer in the semiconductor. Thus a *p-n* junction will exist at a shallow depth. However, it is widely accepted that the ordinary oxidation of *p*-type silicon surface results in an inversion layer having a charge concentration of only $10^{11}$ charge carriers/cm$^2$ as contrasted with a diffused type junction with a diffused layer having a charge concentration of $10^{15}$ carriers/cm$^2$. It should be noted that an inversion layer is induced and when the inducing material, e.g., silicon dioxide, is removed, the inversion layer disappears and the substrate reverts back to *p*-type semiconductor.

The reason why silicon dioxide induces an inversion layer in the semiconductor material is attributed partially to interface states and also to the fact that silicon dioxide has a tendency to become positively charged when in contact with another material. One apparent reason for this is seen in the fact that researchers have been unable to detect hole current flow in glasses (silicon dioxide). For example, when one excites the oxide by radiation (X-ray, gamma), one can always observe an electron emission but no apparent hole flow. These findings clearly show the readiness of a glass to emit electrons but not holes.

Oxidized silicon surfaces have been studied extensively in the past decade in connection with transistors and microcircuits and later in connection with the MOS transistor. All those studies indicate that the oxide induces in silicon a negative charge having a charge concentration of approximately $10^{11}$ charge carriers per square centimeter. The oxide may also be contaminated with foreign ions such as hydrogen or sodium, etc. These ions are usually positive so that they can add to the induced charge and raise it to $10^{12}$ charges/cm$^2$. Generally speaking, the presence of foreign ions is undesirable because their density cannot be controlled very well and they are mobile in the oxide. As a result, the semiconductor industry is making efforts to avoid such contaminations.

SUMMARY OF THE INVENTION

An improved solar cell having an inversion layer with a charge concentration which is orders of magnitude greater than that obtainable with silicon oxide is produced by incorporating an insulating oxide, particularly chromium oxide, in the covering silicon dioxide layer. After the initial silicon dioxide layer is formed on the *p*-type semiconductor layer, a layer of chromium is deposited on the silicon dioxide layer. The combination is heated at temperatures above 800° C., and chromium oxides are formed. An inversion layer is induced having a significantly greater charge concentration.

DETAILED DESCRIPTION OF THE PREFERRED EMBODIMENT

It is well known that when silicon is thermally oxidized, an *n*-type inversion layer will be formed beneath the surface. This fact is widely used in the so-called metal-oxide-silicon triodes. While ordinary oxidation already forms an induced junction, unfortunately the lateral surface conductivity in the inverted layer is quite poor, as a result of the low charge density, e.g., $10^{11}$ charge carriers/cm$^2$. Applicant has discovered through experimentation that this charge density may be improved by orders of magnitude. Particularly, if silicon dioxide is mixed heavily with chromium, the charge density can be increased by about two orders of magnitude. The chromium forms a chromium oxide which mixes with the silicon dioxide.

The exact mechanism which brings about the surprising result is not fully known. However, the following is a probable explanation. The incorporation of metals (metal oxides) into the silicon dioxide could change the amount of charge induced by the oxide covering a semiconductor. From the metals studied, chromium, when incorporated in large densities, induces an extraordinary high density of charge. One explanation may lie in the fact that chromium has many stable oxides. As a result, it can be accommodated in numerous sites in the glass structure. Studies indicate that the presence of chromium does not affect the hole 'immobility,' i.e., the holes can still be regarded as being trapped. On the other hand, the electronic conductivity changes. It appears then that the chromium sites can act as donors and thereby contribute more electrons to the underlying silicon. This could explain the $10^{13}$/cm$^2$ or higher charge density induced by the incorporated chromium oxides.

In one example the improved solar cell was formed in the following manner. A *p*-type layer of silicon was thermally oxidized conventionally in a dry oxygen environment to form a silicon dioxide layer of approximately 600 A depth on the silicon semiconductor. The initial oxide layer was then etched down to 300 A, using a 10 to 1 HF solution, to remove surface contaminents. The device was then placed in a conventional electron-beam evaporator and a layer of chromium metal was evaporated onto the initial oxide layer. The layer of chromium formed was approximately 100 A in a first example and 200 A in a second example. The device was then slowly placed back in the oxidation furnace, used in the initial oxidation step, and heated at about 1,100° C., for about one hour, thereby growing a total layer above the semiconductor surface of about 1,000 A. The resulting product had a semiconductor surface inversion layer (*n*-type) of $10^{12}$ charge carrier/cm² in the first example and $10^{13}$ charge carriers/cm² in the second example. At the high temperature of the final oxidation step, chromium oxides form and mix with the silicon dioxide.

Other metals were tried in place of chromium. Of those tried, vanadium, molybdenum, tungsten, nickel and platinum had substantially no effect, and aluminum caused a decrease of charge density in the inversion layer.

The first step of the process, forming an initial layer of silicon dioxide, can be carried out by other than thermal oxidation. However, the first step is important to prevent the metal from contacting the semiconductor materials. If the metal contacts the semiconductor it will quickly penetrate it and at temperatures in excess of 400° C., the chromium will cause many defects in the semiconductor crystal. It is believed that the initial layer should be at least 200 A in depth.

Initial oxidation could be formed by chemical anodic oxidation, vapor deposition of SiO, evaporation or sputtering of $SiO_2$ and condensation on the semiconductor. Also it appears possible to form the oxide layer of silicon and chromium simultaneously. This could be accomplished by vapor deposition, using a gas including a chromium compound and oxygen.

The steps of forming the initial oxide layer and the chromium layer may individually be carried out conventionally. However, after laying down the chromium layer the device must be heated at a temperature in excess of 800° C., to oxidize the chromium and induce the desired interaction. The overall thickness of the final oxide layer is preferably 800 A to 1,000 A. This thickness is for optical purposes and is not important if the device is not to be used in solar cells. However, if other conventional optical coatings are placed on the device, the final oxide layer created by the process described herein, may be thinned down to about 200 A to 300 A. Insofar as the thickness of the deposited chromium layer is concerned, it appears that the thicker the layer, the greater the increase in charge density.

Semiconductor materials other than silicon could be used but, if the semiconductor is neither silicon nor silicon carbide, the initial oxidation layer will have to be deposited rather than grown by thermal oxidation.

As is well known, the semiconductor surface must be contacted by a metal contact to provide for external connection to the solar cell or other device. Since the inversion layer is induced, when small areas of the oxide coating are removed to provide space for the metal contacts, the inversion layer under the opened areas disappears and the semiconductor material at those surfaces reverts back to *p*-type. These areas could be made *n*-type by diffusion techniques which are well known in the art, and the metal contact laid down would then be any metal forming an ohmic contact with the *n*-type semiconductor. A preferable technique is to metalize the opened surface areas with a metal which forms a Schottky junction with the semiconductor. For example, it is well known that aluminum induces a negative charge inversion layer in an otherwise *p*-type silicon semiconductor when in contact with the semiconductor.

I claim:

1. A semiconductor device comprising, a first layer of semiconductor material having a bulk region of *p*-type conductivity and an inversion surface layer of *n*-type conductivity which forms a p-n junction with said bulk region, a covering layer on said inversion surface, said covering layer comprising oxides of silicon and chromium.

2. A semiconductor device as claimed in claim 1 wherein said device further comprises metallic contacts in direct contact with the surface of said semiconductor material.

3. A semiconductor device as claimed in claim 2, wherein said metallic contacts comprise a metal which forms a Schottky junction with said semiconductor layer.

4. A semiconductor device as claimed in claim 3 wherein said semiconductor layer is a layer of silicon.

5. A semiconductor device as claimed in claim 2 wherein said semiconductor layer is a layer of silicon.

6. A semiconductor device as claimed in claim 4 wherein said covering layer is between 800 A and 1,000 A thick.

* * * * *